United States Patent
Saeedi et al.

(10) Patent No.: US 11,551,089 B2
(45) Date of Patent: *Jan. 10, 2023

(54) FEATURE REORDERING BASED ON SPARSITY FOR IMPROVED MEMORY COMPRESSION TRANSFERS DURING MACHINE LEARNING JOBS

(71) Applicant: ATI Technologies ULC, Markham (CA)

(72) Inventors: Mehdi Saeedi, Markham (CA); Arash Hariri, Markham (CA); Gabor Sines, Markham (CA)

(73) Assignee: ATI Technologies ULC, Markham (CA)

( * ) Notice: Subject to any disclaimer, the term of this patent is extended or adjusted under 35 U.S.C. 154(b) by 358 days.

This patent is subject to a terminal disclaimer.

(21) Appl. No.: 16/836,741

(22) Filed: Mar. 31, 2020

(65) Prior Publication Data

US 2021/0303993 A1 Sep. 30, 2021

(51) Int. Cl.
*G06N 3/08* (2006.01)
*H03M 7/30* (2006.01)
*H03M 7/46* (2006.01)
*G06N 20/00* (2019.01)

(52) U.S. Cl.
CPC .............. *G06N 3/08* (2013.01); *G06N 20/00* (2019.01); *H03M 7/46* (2013.01); *H03M 7/6011* (2013.01)

(58) Field of Classification Search
CPC .... H03M 7/46; H03M 7/6011; H03M 7/3077; G06N 3/08; G06N 3/063; G06N 3/04
See application file for complete search history.

(56) References Cited

U.S. PATENT DOCUMENTS

| | | | | |
|---|---|---|---|---|
| 11,281,470 | B2* | 3/2022 | Schmit | G06F 9/30189 |
| 2018/0046916 | A1 | 2/2018 | Dally et al. | |
| 2019/0108436 | A1 | 4/2019 | David et al. | |
| 2020/0110988 | A1* | 4/2020 | Wang | G06N 3/063 |
| 2020/0119748 | A1* | 4/2020 | Lucarelli | H03M 13/2906 |
| 2020/0133992 | A1* | 4/2020 | Aga | G06F 7/5324 |
| 2021/0111736 | A1* | 4/2021 | Jiang | G06K 9/6228 |
| 2021/0191732 | A1* | 6/2021 | Schmit | G06F 9/3016 |
| 2021/0232407 | A1* | 7/2021 | Liu | G06F 9/445 |
| 2021/0266565 | A1* | 8/2021 | Zhou | G06N 5/04 |
| 2021/0295822 | A1* | 9/2021 | Tomkins | G06F 16/328 |
| 2021/0303993 | A1* | 9/2021 | Saeedi | G06N 20/00 |
| 2021/0303994 | A1* | 9/2021 | Hariri | G06N 20/10 |
| 2021/0342738 | A1* | 11/2021 | Sarferaz | G06Q 10/10 |

OTHER PUBLICATIONS

Rhu et al., "Compressing DMA Engine: Leveraging Activation Sparsity for Training Deep Neural Networks," IEEE International Symposium on High Performance Computer Architecture, 2018, 14 pages.

* cited by examiner

*Primary Examiner* — Lam T Mai
(74) *Attorney, Agent, or Firm* — Volpe Koenig

(57) ABSTRACT

A processing device for executing a machine learning neural network operation includes memory and a processor. The processor is configured to receive input data at a layer of the machine learning neural network operation, receive a plurality of sorted filters to be applied to the input data, apply the plurality of sorted filters to the input data to produce a plurality of different feature maps, compress the plurality of different feature maps according to a sparsity of the feature maps and store the plurality of different feature maps in the memory.

20 Claims, 5 Drawing Sheets

FEATURE REORDERING BASED ON SPARSITY FOR IMPROVED MEMORY COMPRESSION TRANSFERS DURING MACHINE LEARNING JOBS

BACKGROUND

Machine learning (e.g., deep learning) is widely used in a variety of technologies (e.g., image classification) to make predictions or decisions to perform a particular task (e.g., whether an image includes a certain object). A convolutional neural network (CNN) is a class of deep learning algorithms widely used in machine learning applications. These networks typically include multiple layers. At each layer, a set of filters is applied to the output of previous layer, and the outputs of each layer are known as activations or feature maps. The first and last layers in a network are known as the input and output layers, respectively, and the layers in between the first and last layers are typically known as hidden layers.

Machine learning models in supervised learning are trained in order to make predictions or decisions to perform a particular task (e.g., whether an image includes a certain object). During training, a model is exposed to different data. At each layer, the model transforms the data and receives feedback regarding the accuracy of its operations. During an inference stage, the trained model is used to infer or predict outputs on testing samples (e.g., input tensors).

BRIEF DESCRIPTION OF THE DRAWINGS

A more detailed understanding can be had from the following description, given by way of example in conjunction with the accompanying drawings wherein.

DETAILED DESCRIPTION

Figure 1:
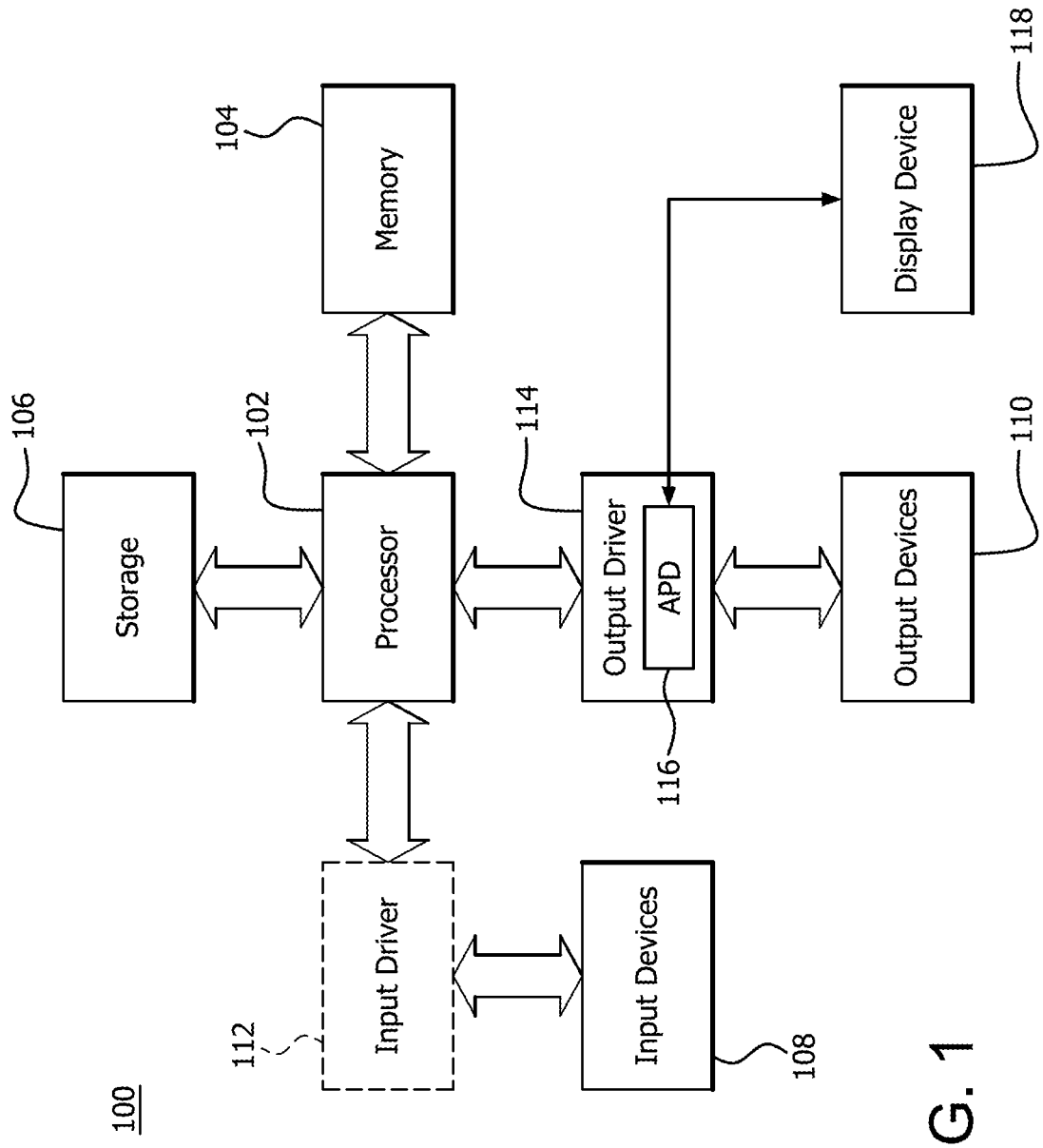
FIG. 1 is a block diagram of an example device in which one or more features of the disclosure can be implemented.

The terms activations and feature maps are used interchangeably in the present disclosure. CNNs are used in different types of technology applications. For simplified explanation purposes, examples described herein include CNNs for image analysis.

The activations of a CNN model (fully or partially) are written to and read from memory for each layer, or a plurality of layers, depending on the particular application. The outputs of each layer are, for example, four dimensional (4D) activations tensors which include an image set that is broken into N batches of feature maps (i.e., channels) C each representing the image and each having a size defined by a height (H) and width (W). The activations tensors are subject to an operation defined by the layer (e.g., convolution kernel, pooling operation), which results in new activation tensors for the next layer.

Deep learning models usually use significant memory bandwidth, which can lead to bandwidth bottleneck, negatively impacting performance, and increased power consumption. The amount of memory used to store the activation tensor data at different layers of machine learning neural networks is typically large such that the activation tensor data cannot be saved in on-chip memory depending on the application. Accordingly, storing the activation tensor data includes transfer of the data to and from off-chip memory.

Sparsity of a group of elements (e.g., elements of a feature map) is measured by an amount of zero values of the group of elements. An increase in sparsity of data typically results in an increased compression ratio (e.g., uncompressed data size/compressed data size) of the data because zero values in the data can be sent with less information than non-zero values. The sparsity of the data in the resulting feature maps (i.e., channels) typically differs between feature maps. Accordingly, two adjacent channels can have different levels of sparsity. Typically, there are no intrinsic patterns of sparsity resulting in the data of typical machine learning neural network models.

The present application provides processing devices and methods for efficiently compressing tensors for memory transfers during an inference stage of the machine learning model by applying filters to the input tensors which are sorted prior to the inference stage at the training stage. The filters are sorted according to a sparsity of the feature maps (i.e., feature maps resulting from applying the sorted filters to input data) such that an amount of sequentially stored (i.e., stored at sequential locations in memory) values of interest (e.g., zero values or small values equal to or less than a threshold value) of the feature maps is larger than an amount of sequentially stored values of interest of the feature maps without sorting the filters according to the sparsity.

Sparsity of a group of elements is defined, for example, according to "full sparsity" (i.e., when each element in the group is a zero value). For example, filters are ordered according to sparse groups (i.e., each element in the group is a zero value) and non-sparse groups (i.e., the group includes at least one non-zero value).

Alternatively, filters are sorted (i.e., ordered) according to their corresponding "partial sparsity." When using partial sparsity, the sorting of the filters is determined, for example, according to a number (or number range) of zero values for a group of elements (e.g., a feature map), a number of consecutive zero values for a group of elements, a percentage (or percentage range) or ratio of the zero values to the total number of values of a group of elements or another metric. The sorting is also determined, for example, based on a comparison of the sparsity of a feature map to a sparsity threshold. The filters can also be ordered according to sparsity levels of the group of elements.

Tensor data can be written into memory in different formats, such as for example, NHWC (i.e., channel first) or NCHW (i.e., width first). In NHWC (or other memory layouts where channel is first), co-located elements of co-located channels will be adjacent in memory.

Features of the present disclosure can be implemented via any of a plurality of different types of compression algorithms such as for example, delta-based compression algorithms, dictionary-based compression algorithms, frequency-based approaches and run-length encoding.

For example, run-length encoding is a form of lossless data compression in which runs of data (sequences in which the same data value occurs in many consecutive data elements) are stored as a single data value and count, rather than as the original run of data. Accordingly, when a larger amount of zero values are stored sequentially in memory, the data is compressed more efficiently. because the sorting causes a larger amount of zero values to be stored sequentially in memory and a larger number of zero runs can be stored as a single data value, thereby reducing the number of memory transfers.

Filters can also be sorted by sparsity based on an amount of values, in a group of elements, which are equal to or lower than an value threshold. For example, when lossy compression is used, the small values (i.e., values equal to or lower than an value threshold) are effectively treated as zero values.

A processing device for executing a machine learning neural network operation is provided which includes memory and a processor. The processor is configured to receive input data at a layer of the machine learning neural network operation, receive a plurality of sorted filters to be applied to the input data, apply the plurality of sorted filters to the input data to produce a plurality of different feature maps, compress the plurality of different feature maps according to a sparsity of the feature maps and store the plurality of different feature maps in the memory.

A machine learning processing method is provided which includes receiving input data at a layer of a machine learning neural network, receiving a plurality of sorted filters to be applied to the input data, applying the plurality of sorted filters to the input data to produce a plurality of different feature maps, compressing the plurality of different feature maps according to a sparsity of the feature maps and storing the plurality of different feature maps in the memory.

A non-transitory computer readable medium is provided which includes stored instructions for causing a computer to execute a machine learning processing method comprising receiving input data at a layer of a machine learning neural network, receiving a plurality of sorted filters to be applied to the input data, applying the plurality of sorted filters to the input data to produce a plurality of different feature maps, compressing the plurality of different feature maps according to a sparsity of the feature maps and storing the plurality of different feature maps in the memory.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU or a stand-alone accelerator. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. The output driver 116 includes an accelerated processing device ("APD") 116 which is coupled to a display device 118. The APD accepts compute commands and graphics rendering commands from processor 102, processes those compute and graphics rendering commands, and provides output to display device 118 for display. As described in further detail below, the APD 116 includes one or more parallel processing units to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and provides graphical output to a display device 118. For example, it is contemplated that any processing system that performs processing tasks in accordance with a SIMD paradigm may perform the functionality described herein. Alternatively, it is contemplated that computing systems that do not perform processing tasks in accordance with a SIMD paradigm performs the functionality described herein.

Figure 2:
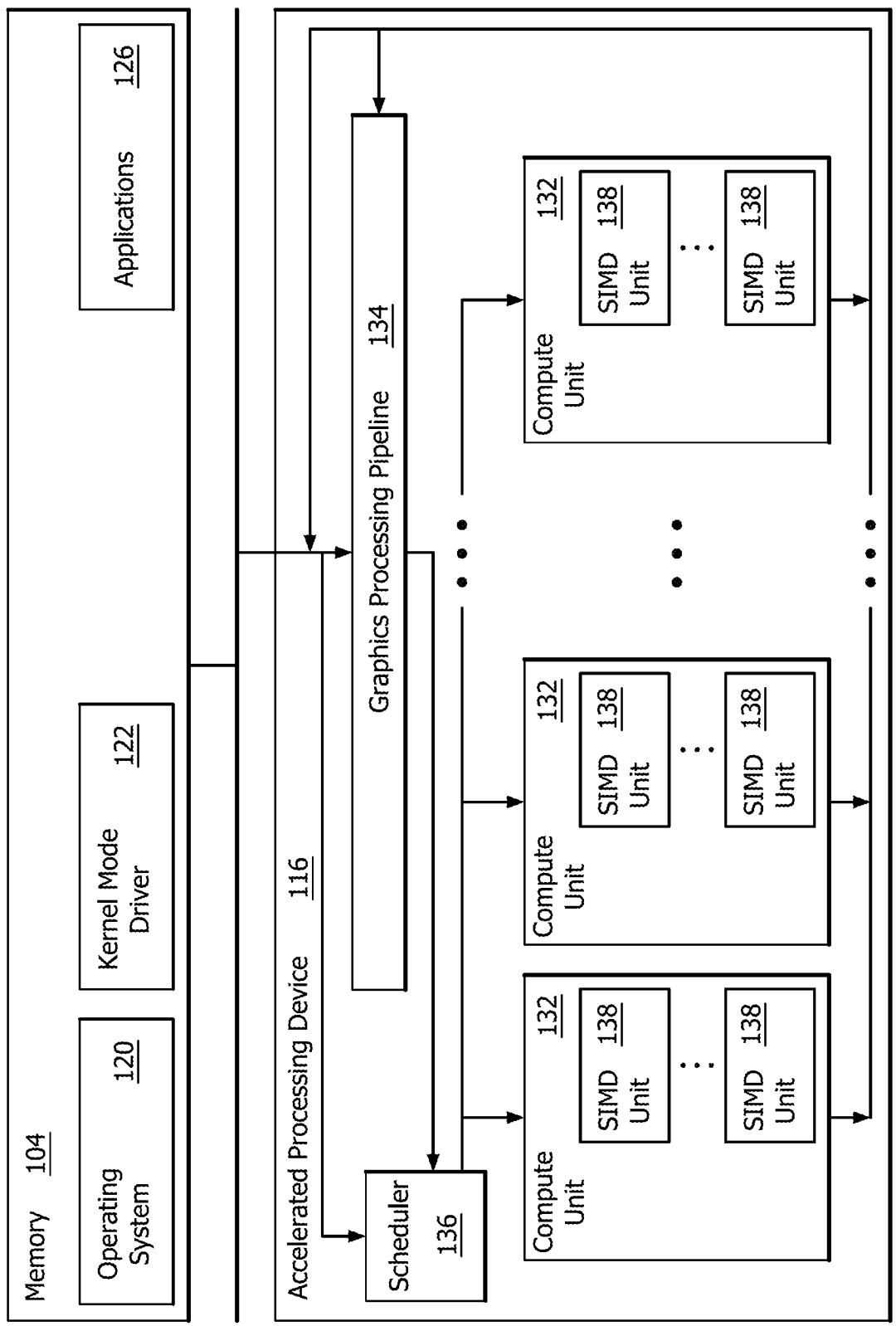
FIG. 2 is a block diagram of the device of FIG. 1, illustrating additional detail.

FIG. 2 is a block diagram of the device 100, illustrating additional details related to execution of processing tasks on the APD 116. The processor 102 maintains, in system memory 104, one or more control logic modules for execution by the processor 102. The control logic modules include an operating system 120, a kernel mode driver 122, and applications 126. These control logic modules control various features of the operation of the processor 102 and the APD 116. For example, the operating system 120 directly communicates with hardware and provides an interface to the hardware for other software executing on the processor 102. The kernel mode driver 122 controls operation of the APD 116 by, for example, providing an application programming interface ("API") to software (e.g., applications 126) executing on the processor 102 to access various functionality of the APD 116. The kernel mode driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that perform operations at the request of the processor 102 in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed sequentially on a single SIMD unit 138 or partially or fully in parallel on different SIMD units 138. Wavefronts can be thought of as the largest collection of work-items that can be executed simultaneously on a single SIMD unit 138. Thus, if commands received from the processor 102 indicate that a particular program is to be parallelized to such a degree that the program cannot execute on a single SIMD unit 138 simultaneously, then that program is broken up into wavefronts which are parallelized on two or more SIMD units 138 or serialized on the same SIMD unit 138 (or both parallelized and serialized as needed). A scheduler 136 performs operations related to scheduling various wavefronts on different compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

The APD 116 is configured to execute machine learning models, including deep learning models. The APD 116 is configured to store activation tensor data at different layers of machine learning neural networks. The APD 116 is configured to perform, at each layer, operations (e.g., convolution kernel, pooling operation) to input data (e.g., image, activations tensors) of a previous layer and apply filters to the input data to provide tensor data for the next layer.

As described above, the amount of memory used to store the activation tensor data at different layers of neural networks is typically large (e.g., in the early layers) such that the activation tensor data cannot be saved in on-chip memory (e.g., memory at the APD 116). Accordingly, storing the activation tensor data includes transfer of the data between the APD 116 and off-chip memory (e.g., memory 104) via a link (e.g., a bus). The APD 116 is configured to compress the data to be transferred to off-chip memory (e.g., save bandwidth).

The APD 116 is configured to compress the tensor data by changing the order in which the tensor values are stored according to any of a plurality of feature map sparsity metrics, using any of a plurality of different types of memory formatting with channel first configuration, and using any of a plurality of types of compression algorithms. For simplified explanation purposes, the examples described herein include delta-based compression of 4D tensor values by changing the order in which the tensor values are written to memory according to NHWC (i.e., channel first) formatting based on sparsity of the feature maps.

Figure 3:
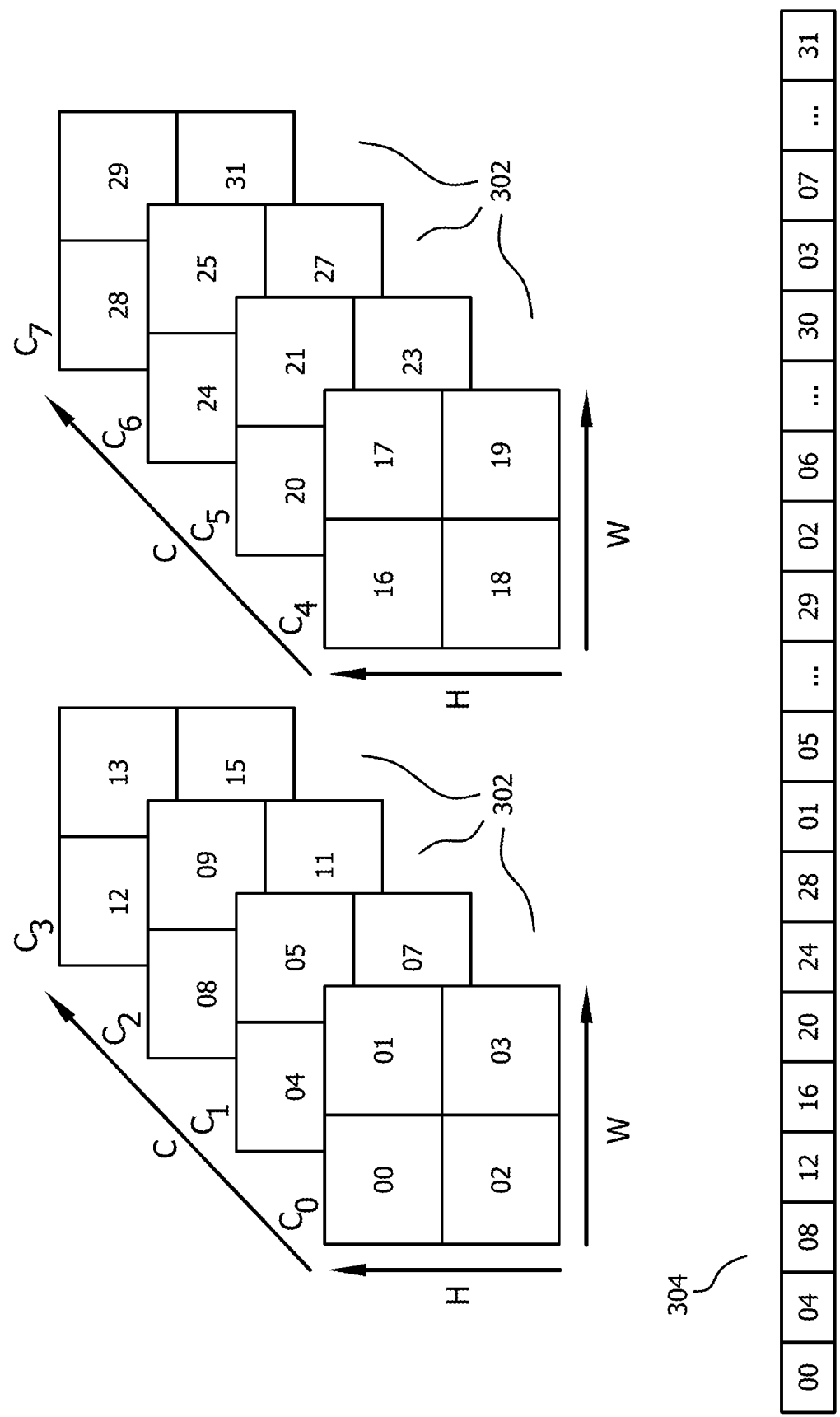
FIG. 3 is a diagram illustrating a storage layout of example activation tensors values, according to NHWC formatting, prior to being sorted in memory according to features of the present disclosure.

FIG. 3 is a diagram illustrating a storage layout of example 4D activation tensors values, according to NHWC formatting, prior to being sorted in memory according to features of the present disclosure.

In NHWC, the activation tensors (e.g., 4D activation tensors) are stored channel first. For example, 4D activation tensors are written to memory by mapping each 4D tensor value via an offset function which inputs logical index (n, h, w, c) and returns an address displacement to where each value is located. Accordingly, two tensor values, stored adjacent in memory, mostly share the same indices n, h, and w, but include different w indices (e.g., the w index of the second tensor value differs from the first tensor value by 1). Upper-case letters denote the 4 dimensions (i.e., N, H, W and C) of the activation tensors and lower-case letters denote the indices (i.e., n, h, w and c) for each dimension.

When NHWC formatting is used, for example, to store tensor values of a plurality of feature maps each representing an activation, element at a first location (e.g., values row 1, column 1) of each feature map are stored in memory first, followed by the element at a second location (e.g., values row 1, column 2) of each feature map, and so on, until each of the elements for each batch is stored in memory.

The activation tensors shown in FIG. 3 include 8 feature maps 302 (i.e., 8 channels) and each feature map 302 is a 2×2 matrix of elements. The dimensions of the feature maps shown in FIG. 3 are merely an example. Features of the present disclosure can be implemented using any number of feature maps (i.e., channels) with dimensions (i.e., rows of width W and columns of height H) different than those shown in FIG. 3.

Each feature map 302 is a different representation of an input tensor to which a different filter (e.g., weight) is applied. For example, an input tensor is subject to an operation (e.g., convolution kernel, pooling operation) using a first filter, which produces the first feature map 302 ($C_0$) that includes element values 00, 01, 02 and 03. The an input tensor is then subject to an operation using a second filter, which produces the second feature map 302 ($C_1$) that includes element values 04, 05, 06 and 07. The process continues with different filters to produce each feature map 302 ($C_0$-$C_7$).

FIG. 3 also shows an example memory layout illustrating the locations, in memory portion 304 in which each element value is stored, according to NHWC formatting, without sorting (i.e., without reordering) the element values in memory according to features of the present disclosure. As shown, the first element 00 of the first feature map 302 ($C_0$) is stored at a first location in memory portion 304. The co-located first element 04 of the second feature map 302 ($C_1$) is then stored at a second location in memory portion 304 adjacent to the first element 00 of the first feature map 302 ($C_0$).

After each of the co-located first elements (i.e., 08, 12, 16, 20, 24 and 28) of the remaining feature maps 302 ($C_2$ to $C_7$) are stored in the next locations in memory portion 304, the second element 01 (along the width W from element 00) of the first feature map 302 ($C_0$) is stored, followed by the co-located second element 05 of the second feature map 302 ($C_0$).

After each of the co-located second elements (i.e., 09, 13, 17, 21, 25 and 29) of the remaining feature maps 302 ($C_2$ to $C_7$) are stored in the next locations in memory portion 304, element 02 (along the height H from element 00) of the first feature map 304 ($C_0$) is stored, followed by the co-located element 06 of the second feature map 302 ($C_1$) and then each of the co-located elements (i.e., 10, 14, 18, 22, 26 and 30) of the remaining feature maps 302 ($C_2$ to $C_7$) in the next locations in memory portion 304.

After the element 30 is stored, element 03 of the first feature map 304 ($C_0$) is stored, followed by the co-located element 07 of the second feature map 302 ($C_1$) followed by the remaining co-located elements (11, 15, 19, 23, 27 and 31) are then stored in memory portion 304.

As described above, efficiency of compression (e.g., delta-based compression) of the tensor values depends, for example, on sparsity between the adjacent data stored in the memory.

Figure 4:
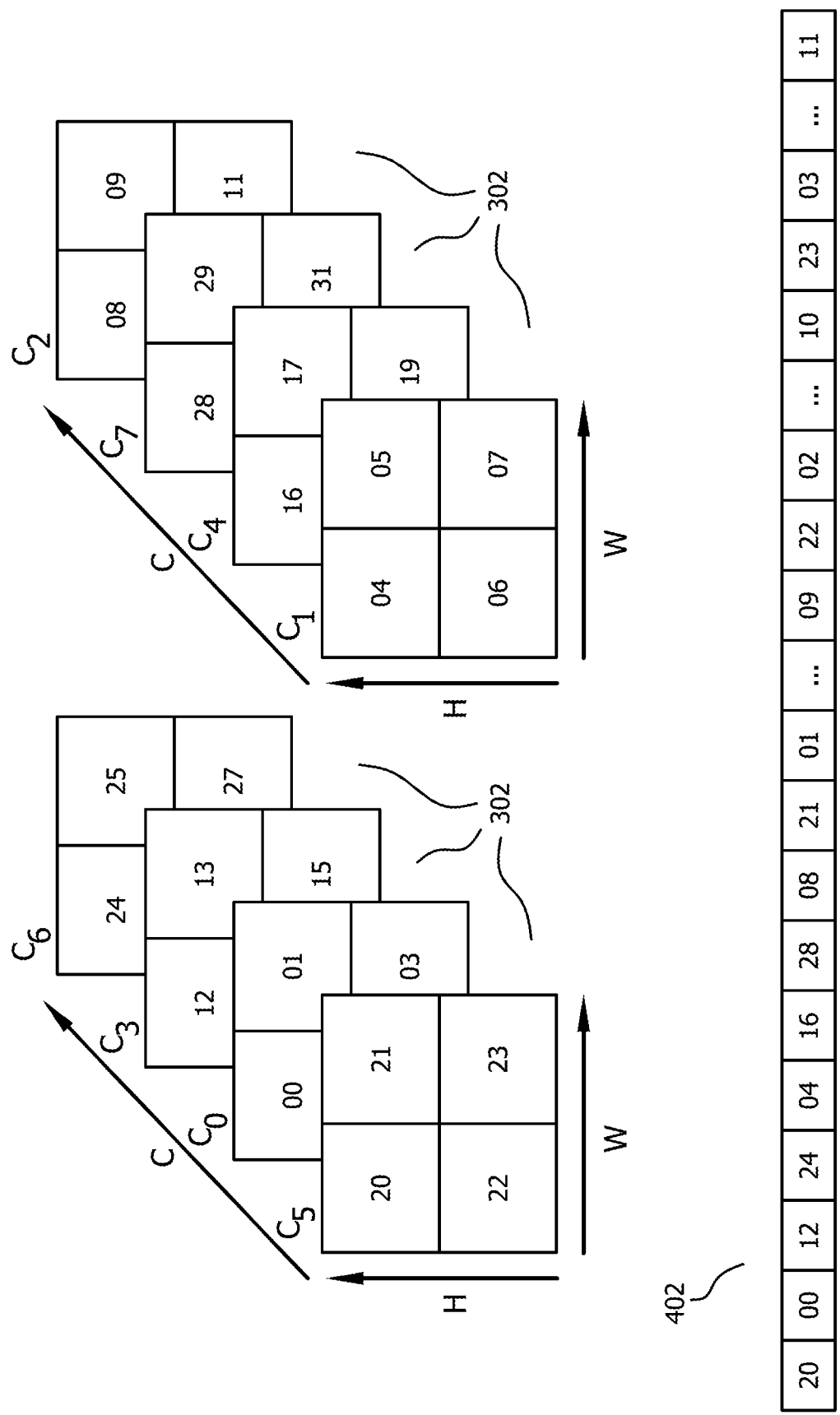
FIG. 4 illustrates an example sorting of the feature maps shown in FIG. 3 according to a feature map sparsity and an example memory layout of the tensor values stored in memory, using NHWC formatting, according to the sorting.

FIG. 4 illustrates an example of how the feature maps 302 shown in FIG. 3 are sorted during the training stage according to a feature map sparsity and an example memory layout of the element values stored in memory, using NHWC formatting, according to the sorting. That is, the channels (i.e., filters) are sorted, during training, according to a sparsity of the feature maps such that an amount of sequentially stored zero values (i.e., stored at sequential locations in memory) of the feature maps is larger than an amount of sequentially stored zero values of the feature maps without sorting the channels according to the sparsity. Because the channels are sorted according to sparsity, the number of memory transfers performed to execute the model during the inference stage is reduced (i.e., the memory bandwidth is reduced).

After or during the training (i.e., prior to the inference stage), the data of the different feature maps 302 (i.e., channels) are examined to determine the sparsity of the feature maps 302. Based on the results, it is determined that each of a plurality of filters applied to an activation produces a new activation tensor which can be evaluated based on sparsity level of the feature maps.

Table 1 below shows example filter information determined during the training stage, which includes the sparsity of different feature maps 302 (C0-C7) resulting from eight different filters applied to an input tensor subject to an operation (e.g., convolution kernel, pooling operation). For example, the sparsity of each feature map 302 (C0-C7) is determined during training of a model which can include many iterations of applying different filters to input tensors. In the example shown in Table 1, the sparsity is defined by the number of zero values for each feature map 302 (C0-C7). As described above, however, a number of zero values is an example of sparsity. Alternatively, sparsity can also be defined, for example, according to a number of consecutive zero values for a group of elements, a percentage (or percentage range) or ratio of the zero values to the total number of values of a group of elements or an amount of values equal to or lower than an value threshold.

TABLE 1

| FILTER | FEATURE MAP | SPARSITY |
|---|---|---|
| FIRST FILTER | $C_O$ | 1 |
| SECOND FILTER | $C_1$ | 2 |
| THIRD FILTER | $C_2$ | 4 |
| FOURTH FILTER | $C_3$ | 1 |
| FIFTH FILTER | $C_4$ | 3 |
| SIXTH FILTER | $C_5$ | 0 |
| SEVENTH FILTER | $C_6$ | 1 |
| EIGHTH FILTER | $C_7$ | 3 |

For example, as shown in Table 1, a first filter applied to an input tensor results in the first feature map ($C_0$) having a sparsity value of 1 (i.e. a zero value for 1 of the 4 elements), a second filter applied to the input tensor results in the second feature map 302 ($C_1$) having a sparsity value of 2 (i.e. zero values for 2 of the 4 elements), a third filter applied to the input tensor results in the third feature map 302 ($C_2$) having a sparsity value of 4 (i.e. zero values for each of the 4 elements), a fourth filter applied to the input tensor results in the fourth feature map 302 ($C_3$) having a sparsity value of 1 (i.e. a zero value for 1 of the 4 elements), a fifth filter applied to the input tensor results in the first feature map ($C_4$) having a sparsity value of 3 (i.e. zero values for 3 of the 4 elements), a sixth filter applied to the input tensor results in the second feature map 302 ($C_5$) having a sparsity value of 0 (i.e. no zero values for each of the 4 elements), a seventh filter applied to the input tensor results in the third feature map 302 ($C_6$) having a sparsity value of 1 (i.e. a zero value for 1 of the 4 elements), and an eighth filter applied to the input tensor results in the fourth feature map 302 ($C_7$) having a sparsity value of 3 (i.e. zero values for 3 of the 4 elements).

Based on the filter information (e.g., information shown in Table 1), the neural network is restructured by shuffling the filters to reorder (i.e., sort) the output channels. For example, the eight filters are applied to the input tensor data in an order different from the order shown in FIG. 3 in which the filters are applied by NHWC formatting without resorting according to sparsity (e.g., the number of zero values for each feature map 302 (C0-C7) of the feature maps 302. The element values are then stored in memory, using NHWC formatting.

For example, the filters are applied to the input tensor data in an order different from the order of the feature maps 302 shown in FIG. 3. That is the filters are sorted according to feature map sparsity using the predetermined sparsity levels shown in Table 1. Accordingly, as shown in FIG. 4, the first element 20 of feature map 302 ($C_5$) is stored at a first location in memory portion 402. The co-located first element 00 of feature map 302 ($C_1$) is then stored at a second location in memory portion 402 adjacent to the first element 20 of feature map 302 ($C_5$). After each of the co-located first elements (i.e., 12, 24, 04, 16, 28 and 08) of the remaining feature maps 302 ($C_3$, $C_6$, $C_1$, $C_4$, $C_7$, $C_2$) are stored in the next locations in memory portion 402, the second element 21 (along the width W from element 20) of the feature map 302 ($C_5$) is stored, followed by the co-located second element 01 of the feature map 302 ($C_0$).

After each of the co-located second elements (i.e., 13, 25, 05, 17, 29 and 09) of the remaining feature maps 302 ($C_3$, $C_6$, $C_1$, $C_4$, $C_7$, $C_2$) are stored in the next locations in memory portion 402, element 22 (along the height H from element 20) of the feature map 402 ($C_5$) is stored, followed by the co-located element 02 of feature map 302 ($C_0$). After each of the co-located elements (i.e., 14, 26, 06, 18, 30 and 10) of the remaining feature maps 302 ($C_3$, $C_6$, $C_1$, $C_4$, $C_7$, $C_2$) are stored in the next locations in memory portion 402, element 23 of feature map 402 ($C_5$) is stored, followed by the co-located elements 03, 15, 27, 07, 19, 31 and 11 of the remaining feature maps 302 ($C_3$, $C_6$, $C_1$, $C_4$, $C_7$, $C_2$).

Using the model developed during training, which includes the sorted filters described above, the sorted filters are applied to the input tensors during an inference stage of the machine learning model. Due to the amount of sequential zero values (i.e., to be stored at sequential locations in memory) of the sorted feature maps being larger than an amount of sequential zero values of feature maps not sorted according to the sparsity, the tensor data is compressed more efficiently during the inference stage of executing the model. When the sorting causes a larger amount of zero values to be stored sequentially in memory, the data is compressed (e.g., using run length encoding) more efficiently. For example, run-length encoding is a form of lossless data compression in which runs of data (sequences in which the same data value occurs in many consecutive data elements) are stored as a single data value and count, rather than as the original run of data. Accordingly, because the sorting causes a larger amount of zero values to be stored sequentially in memory, a larger number of zero runs can be stored as a single data value, thereby reducing the number of memory transfers.

Figure 5:
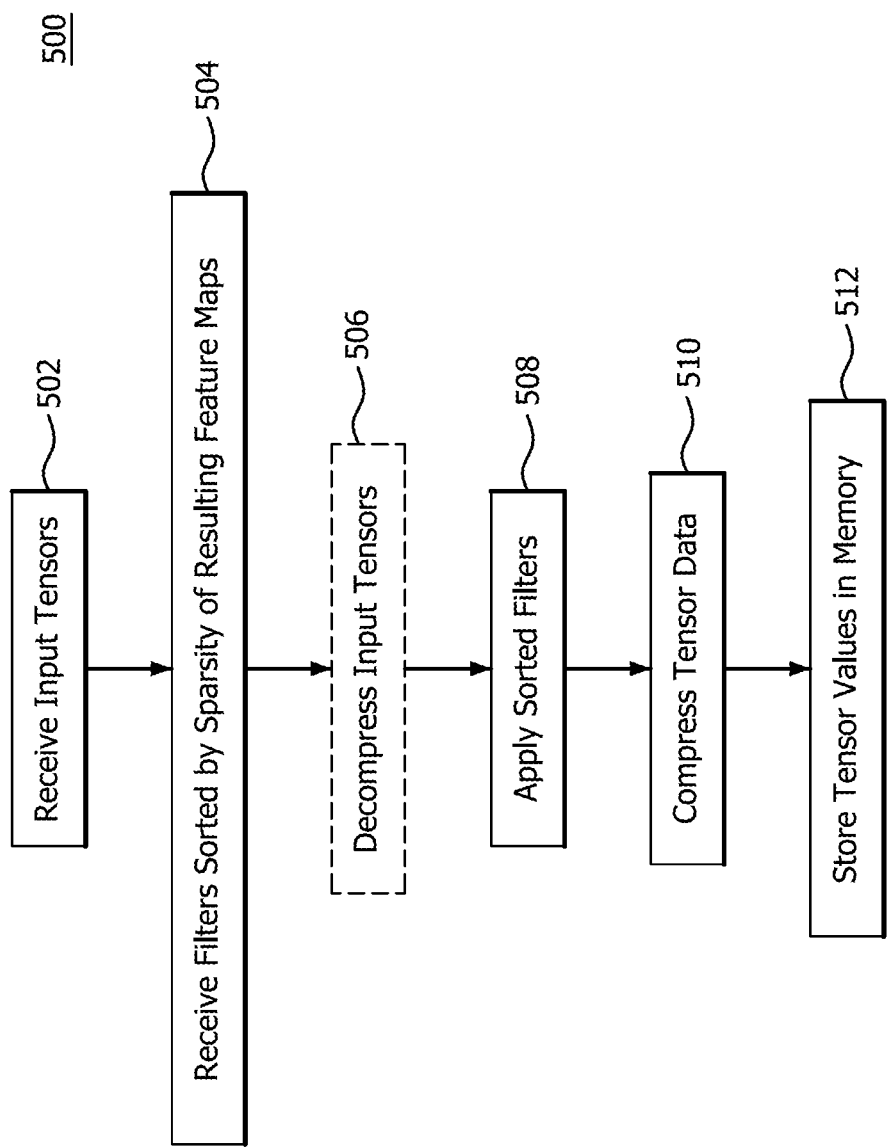
FIG. 5 is a flow diagram illustrating an example method of executing a machine learning operation according to features of the disclosure.

FIG. 5 is a flow diagram illustrating an example method of improving compression during an inference stage of executing a machine learning operation according to features of the disclosure.

At block 502, the method 500 includes receiving input tensors. For example, the input tensor is received (e.g., by a processor) during the inference stage at a layer of a CNN.

At block 504, the method 500 includes receiving, during the inference stage, a plurality of sorted filters to be applied to the input tensors. The sorted filters received during the inference stage are filters which have been sorted prior to the inference stage (e.g., during training), such as for example, the sorted filters shown in FIG. 4.

When input tensors are read from memory in a compressed format, the input tensors are decompressed, as shown in phantom at block 506. For example, the input tensors of a layer are decompressed by a processor such that the tensors can be subject to an operation (e.g., convolution kernel, pooling operation) which results in new activation tensors for the next layer. In some examples, input tensors are written to memory in a compressed format and the uncompressed input tensors are stored locally (e.g., local to the processor) and used as next input data for a next layer of the machine learning neural network. When the input tensors are not read from memory in a compressed format, the method proceeds to block 508.

At block 508, the method 500 includes applying the plurality of sorted filters to the input tensors received at block 504. For example, the plurality of sorted filters are the filters sorted according to a sparsity of each feature map 302.

At block 510, the method 500 includes compressing the tensor data (e.g., the resulting plurality of feature maps 302). For example, the tensor data is compressed and sent across a link (e.g., a bus) to a non-local memory (e.g., off-chip memory). Because sorting according to sparsity causes a larger amount of zero values to be stored sequentially in memory than feature maps not sorted according to sparsity, the data is compressed (e.g., using run length encoding) more efficiently.

At block 512, the method 500 includes storing the tensor data. For example, the tensor data is stored in memory, using NHWC formatting. Because the channels are sorted according to sparsity, the number of memory transfers performed to execute the model during the inference stage is reduced (i.e., the memory bandwidth is reduced).

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the accelerated processing device 116, the scheduler 136, the graphics processing pipeline 134, the compute units 132, and SIMD units 138 may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A processing device for executing a machine learning neural network operation comprising:
   memory; and
   a processor configured to:

receive input data at a layer of the machine learning neural network operation;
receive a plurality of sorted filters to be applied to the input data;
apply the plurality of sorted filters to the input data to produce a plurality of different feature maps;
compress the plurality of different feature maps according to a sparsity of the feature maps; and
store the plurality of different feature maps in the memory.

2. The processing device of claim 1, wherein the machine learning neural network operation is executed at an inference stage and the sorted filters are sorted during training prior to executing the machine learning neural network operation at the inference stage.

3. The processing device of claim 1, wherein the processor is configured to store the plurality of different feature maps in the memory using NHWC formatting.

4. The processing device of claim 1, wherein the processor is configured to compress the plurality of different feature maps using run length encoding.

5. The processing device of claim 1, wherein the sparsity of the different feature maps is determined according to sparse feature maps, in which each element in a feature map is a zero value, and non-sparse feature maps each having at least one non-zero value.

6. The processing device of claim 1, wherein the sparsity is determined according to one of: a number of zero values of a feature map; a number of consecutive zero values of a feature map; and a percentage of the zero values to a total number of values of a feature map.

7. The processing device of claim 1, wherein the sparsity is determined based on an amount of values of a feature map which are equal to or lower than an value threshold.

8. The processing device of claim 1, wherein the processor is further configured to store the compressed different feature maps in the memory according to the sparsity by transferring the compressed different feature maps across a link, and
an amount of memory transfers used to store the compressed different feature maps resulting from the sorted filters is less than an amount of memory transfers used to store the compressed different feature maps resulting from unsorted filters.

9. The processing device of claim 1, wherein the processor is further configured to decompress the input data when the input data is read from the memory in a compressed format.

10. The processing device of claim 9, wherein the processor is further configured to write the input data to the memory in the compressed format and use the input data in an uncompressed format as next input data for a next layer of the machine learning neural network.

11. A machine learning processing method comprising:
receiving input data at a layer of a machine learning neural network;
receiving a plurality of sorted filters to be applied to the input data;
applying the plurality of sorted filters to the input data to produce a plurality of different feature maps;
compressing the plurality of different feature maps according to a sparsity of the feature maps; and
storing the plurality of different feature maps.

12. The method of claim 11, wherein a machine learning neural network operation is executed at an inference stage and the sorted filters are sorted during training prior to executing the machine learning neural network operation at the inference stage.

13. The method of claim 11, further comprising storing the plurality of different feature maps using NHWC formatting.

14. The method of claim 11, further comprising compressing the plurality of different feature maps using run length encoding.

15. The method of claim 11, wherein the sparsity of the different feature maps is determined according to sparse feature maps, in which each element in a different feature map is a zero value, and non-sparse feature maps each having at least one non-zero value.

16. The method of claim 11, wherein the sparsity is determined according to one of: a number of zero values of a feature map; a number of consecutive zero values of a feature map; and a percentage of the zero values to a total number of values of a feature map.

17. The method of claim 11, wherein the sparsity is determined sparsity based on an amount of values of a feature map which are equal to or lower than an value threshold.

18. The method of claim 11, further comprising decompressing the input data when the input data is read from memory in a compressed format.

19. The method of claim 18, further comprising writing the input data to the memory in the compressed format and using the input data in an uncompressed format as the next input data for a next layer of the machine learning neural network.

20. A non-transitory computer readable medium having stored instructions for causing a computer to execute a machine learning processing method comprising:
receiving input data at a layer of a machine learning neural network;
receiving a plurality of sorted filters to be applied to the input data;
decompressing the input data;
applying the plurality of sorted filters to the input data to produce a plurality of different feature maps;
compressing the plurality of different feature maps according to a sparsity of the feature maps; and
storing the plurality of different feature maps.

* * * * *